United States Patent [19]

Strandh

[11] 4,015,200
[45] Mar. 29, 1977

[54] MULTICONDUCTOR CABLE TESTING APPARATUS
[75] Inventor: Mix Tommy Strandh, Horby, Sweden
[73] Assignee: Malmo Testequipment AB, Horby, Sweden
[22] Filed: Nov. 24, 1975
[21] Appl. No.: 634,350
[30] Foreign Application Priority Data
  Nov. 25, 1974  Sweden .............................. 7414740
[52] U.S. Cl. ............................. 324/51; 324/73 AT
[51] Int. Cl.² ........................................ G01R 31/02
[58] Field of Search .......................... 324/51, 66, 73
[56] References Cited
   UNITED STATES PATENTS
3,495,172  2/1970  Davis .................................. 324/51

3,594,635  7/1971  Minamii ............................. 324/51
3,728,616  4/1973  Cheek et al. ....................... 324/51
3,795,857  3/1974  Brown ................................. 324/51

FOREIGN PATENTS OR APPLICATIONS
193,003  11/1957  Austria ................................ 324/66

Primary Examiner—Gerard R. Strecker
Attorney, Agent, or Firm—Fleit & Jacobson

[57] ABSTRACT

Multiconductor cable testing apparatus for sequentially testing the conductors of an electric cable for open-circuit, short-circuit and for incorrect connection, the results of the tests being visually displayed so that the actual fault and the conductor or conductors involved can be easily determined.

5 Claims, 1 Drawing Figure

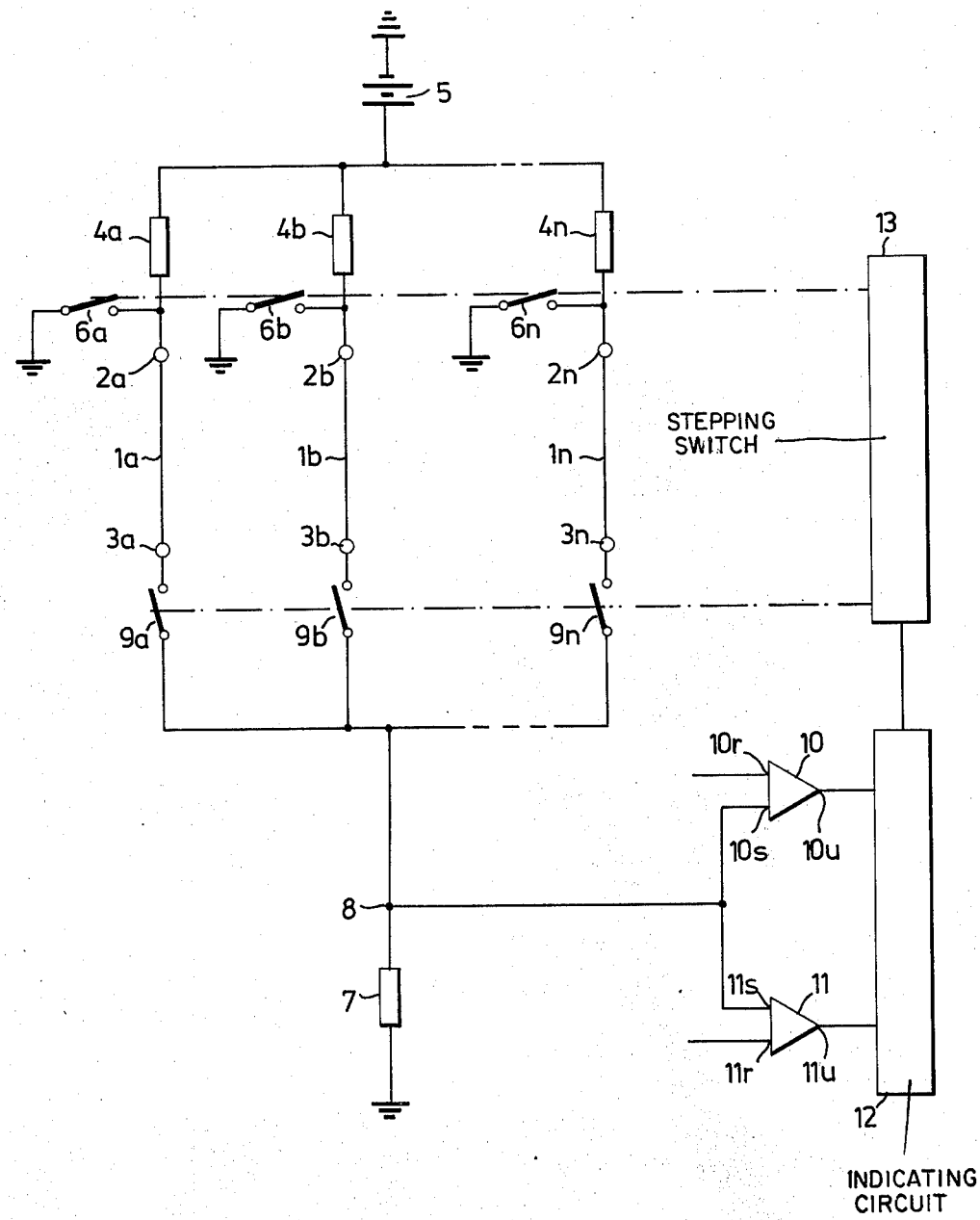

MULTICONDUCTOR CABLE TESTING APPARATUS

FIELD OF THE INVENTION

The present invention relates to a multiconductor cable testing apparatus for checking the wiring and electrical characteristics of multiconductor electric cables.

PRIOR ART

Known methods of making the above electrical checks require tedious and time consuming manual operatings which are subject to human error. Certain prior automatic or semiautomatic equipment has been devised to perform these functions, but for one reason or another they have been found to be unsatisfactory. In addition, they are rather cumbersome, involve complex circuitry, have rather complex methods of operation, and are difficult to calibrate and repair in the field.

SUMMARY OF THE INVENTION

It is an object of this invention to provide a testing apparatus for the individual conductors of multiconductor cables, which is of simple construction, but which positively detects short circuits between conductors, open-circuits and wrong wiring of the conductors.

According to the present invention a multiconductor cable testing apparatus comprises a plurality of pairs of terminal connectors for connection to the ends of a corresponding plurality of conductors to be tested, and a test voltage source in series with each of said pairs of connectors. A corresponding plurality of normally open first contacts are each connected in series with a corresponding one of the pairs of terminal connectors. Furthermore, a corresponding plurality of first impedance means are each connected in series with a corresponding one of the pairs of terminal connectors. Second impedance means are connected in series with each of the first contacts. A corresponding plurality of normally open second contacts are arranged for applying a reference potential when closed, to one terminal connector of a corresponding one of the pairs of terminal connectors. Also incorporated in the testing apparatus is a voltage sensing means for sensing the voltage across the second impedance means.

BRIEF DESCRIPTION OF THE DRAWING

The present invention will now be described in greater detail, by way of example, with reference to the accompanying drawing, in which the sole FIGURE is a schematic circuit diagram of a preferred form of a multiconductor cable testing apparatus.

DESCRIPTION OF THE PREFERRED EMBODIMENT

A multiconductor cable to be tested is connected with its individual conductors $1a - 1n$ between a corresponding plurality of pairs of terminals $2a - 3a, 2b - 3b$, to $2n - 3n$ in successive order. The terminals $2 - 3$ may be of any suitable form of electrical connector of known type.

A plurality of high resistance impedances $4a - 4n$ are connected between a single D.C. test voltage source 5 and each of the terminal connectors $2a - 2n$. A plurality of contacts $6a - 6n$ are connected between ground and each of the terminal connectors $2a - 2n$. A high resistance impedance 7 has one end thereof connected to ground and the other end connected to a terminal 8. A plurality of contacts $9a - 9n$ are each connected between the terminal 8 and the respective terminal connectors $3a - 3n$.

The terminal 8 is connected to two voltage comparators 10 and 11, arranged in parallel. The comparators have an output terminal $10u$ and $11u$, respectively, a reference voltage input terminal $10r$ and $11r$, respectively, and a signal voltage terminal $10s$ and $11s$, respectively, the terminals $10s$ and $11s$ being connected to the terminal 8. The comparator 10 is provided to generate an output signal at its output terminal $10u$ if the input signal to the input terminal $10s$ exceeds a reference voltage which is applied to its input terminal $10r$. The reference voltage can have any value above zero volts, but below $R_b \cdot V/(R_a + R_b)$ volts, in which V is the amplitude of the test voltage delivered from the voltage source 5, $R_a$ is the resistance of each of the impedances $4a - 4n$, and $R_b$ is the resistance of the impedance 7. It is to be understood that the conductor resistance is negligible in comparison with the resistances $R_a$ and $R_b$.

The comparator 11 is provided to generate an output signal at its output terminal $11u$ if the input signal applied to input terminal $11s$ exceeds a reference voltage which is applied to its input terminal $11r$. The reference voltage can have any value above $R_b \cdot V/R_a + R_b)$ volts, but below $R_b \cdot V/(0.5R_a + R_b)$ volts.

The output terminals $10u$ and $11u$ are connected to a fault indicating circuit 12. The circuit 12 is of known construction and of the type which presents a visual indication in response to a predetermined input signal. The circuit 12 is provided to indicate the particular fault and particular conductor when a fault is located.

An electro-magnetic stepping switch 13 is provided to perform stepping operations enabling each of the conductors $1a - 1n$ to be sequentially individually tested for faults. The stepping switch 13 is also provided to advance a counter incorporated in the indicating circuit 12, thereby enabling the circuit 12 to indicate the number of the conductor being tested. The stepping switch 13 has associated therewith a stepping relay having an armature and a ratchet mechanism of known construction. The stepping switch is of the type which is capable of sequentially performing the following operations: closing contact $9a$, closing contact $6a$ while maintaining contact $9a$ closed, opening contacts $6a$ and $9a$ and closing contact $9b$, closing contact $6b$ while maintaining contact $9b$ closed, opening contacts $6b$ and $9b$, and so forth, until the final step of opening contacts $6n$ and $9n$. The maintaining of the contacts 6 closed may be performed by utilizing relay means of slow action type.

The operation of the sequential testing of the conductors of the cable will now be described in greater detail. When the stepping switch 13 is energized, it first closes the contact $9a$. If the conductor $1a$ is open-circuited, then the potential at terminal 8 will be zero volts. This produces low outputs on both the comparators 10 and 11. The indicating circuit 12 will indicate an open-circuit condition for the conductor $1a$. If, however, there is a short-circuit between conductor $1a$ and any one of the other conductors $1b - 1n$, the potential across terminal 8 will be $R_b \cdot V/(0.5R_a + R_b)$ volts as determined by Ohm's law. Thus, both comparators will produce high outputs causing the indicating circuit 12 to indicate a short-circuit between conductor 1a and one of the conductors 1b – 1n.

Upon the completion of the testing of conductor 1a for open-circuit and short-circuit, the stepping switch 13 closes the contact 6a while maintaining the contact 9a closed. The contact 6a will then apply ground potential, i.e. a reference potential, to terminal connector 2a. If the wiring is correct, i.e. if conductor 1a is joined to its allotted terminal connector at each end, the potential at the terminal 8 will be zero volts. If, however, conductor 1a is not joined to its allotted terminal connector at each end, e.g. if conductor 1a is connected between terminal connector 2a and any one of the terminal connectors 3b – 3n, and if conductor 1c, for example, is connected between terminal connector 2c and terminal connector 3a, the potential at the terminal 8 will be $R_b \cdot V/(R_a + R_b)$ volts as determined by Ohm's law. This results in a high output from the comparator 10 and low output from the comparator 11, causing the indicating circuit 12 to indicate an incorrect wiring connection for the conductor 1a.

Upon the completion of the testing of the conductor 1a, the stepping switch 13 opens the contacts 6a and 9a and closes the contact 9b. A new test cycle is thus initiated for testing the conductor 1b. The testing continues sequentially so that each conductor is individually tested for the above possible faults.

In an alternative, the testing apparatus is provided to sequentially first perform a first testing of all conductors only for open-circuits and short-circuits, all the contacts 6a – 6n being open during this testing, and thereafter to sequentially perform a second testing of all conductors only for incorrect wiring.

Upon the completion of the testing for open-circuits, short-circuits and incorrect wiring, a measurement of the resistance of each conductor can be made.

The embodiments described above utilize two comparators 10 and 11. In a further modified form, a third comparator may also be incorporated in the testing apparatus and arranged to produce an output signal if no fault is detected in the particular conductor being tested. If no fault is detected, the indicating circuit 12 may be provided with visual means to indicate that no fault in the conductor has been found.

In a yet further modified form the comparators 10 and 11 may be replaced by suitable voltage sensing instruments.

The various circuit components of the testing apparatus have been described as being of electro-magnetic type, merely for the purpose of convenience and simplicity of illustration. It will be appreciated that electronic solid state components may alternatively be utilized.

Whilst the embodiments of the present invention as herein disclosed, constitute preferred form, it is to be understood that further modifications can be made without departing from the true spirit and scope of the invention as defined in the appended claims.

What I claim and desire to receive by Letters Patent is:

1. A multiconductor cable testing apparatus, comprising:
   a. a plurality of pairs of terminal connectors for connection to the ends of a corresponding plurality of conductors to be tested;
   b. a test voltage source in series with each of said pairs of connectors;
   c. a corresponding plurality of normally open first contacts, each in series with a corresponding one of said pairs of terminal connectors;
   d. a corresponding plurality of first impedance means, each in series with a corresponding one of said pairs of terminal connectors;
   e. second impedance means in series with each of said first contacts;
   f. a corresponding plurality of normally open second contacts for applying a reference potential when closed, to one terminal connector of a corresponding one of said pairs of terminal connectors;
   g. the testing apparatus having a first testing position wherein a selected one of said first contacts is closed and the corresponding second contact open, and a second testing position wherein said selected one of said first contacts and said corresponding second contact are both closed; and
   h. a single voltage sensing means for sensing the voltage across said second impedance means in said first and second testing positions, predetermined values of the sensed voltages across said second impedance means representing open-circuit, short-circuit and incorrect wiring, respectively, for the conductor under test.

2. Apparatus according to claim 1, wherein sequentially operated relay means is provided for testing each conductor in turn, for open-circuit, short-circuit and incorrect connection.

3. Apparatus according to claim 2, wherein said relay means, for each conductor to be tested is sequence, closes the associated first contact to perform a first test for open-circuit and closed-circuit, and then closes the associated second contact whilst maintaining the first contact closed to perform a second test for incorrect connection of the conductors.

4. Apparatus according to claim 1, wherein said voltage sensing means includes first and second comparator means arranged in parallel for comparing said voltage across said second impedance means with a first and a second reference voltage respectively in said first and second comparator means.

5. Apparatus according to claim 4, wherein said first reference voltage is above zero volts, but below $R_b \cdot V/(R_a + R_b)$ volts, and said second reference voltage is above $R_b \cdot V/(R_a + R_b)$ volts, but below $R_b \cdot V/(0.5 R_a + R_b)$ volts, wherein $R_a$ is the resistance of each of said first impedance means, $R_b$ is the resistance of said second impedance means, and V is the voltage of said test voltage source.

* * * * *